United States Patent
Wynn

[19]

[11] Patent Number: 6,009,317
[45] Date of Patent: Dec. 28, 1999

[54] METHOD AND APPARATUS FOR COMPENSATING FOR IMBALANCES BETWEEN QUADRATURE SIGNALS

[75] Inventor: Stephen R. Wynn, Lynchburg, Va.

[73] Assignee: Ericsson Inc., Research Triangle Park, N.C.

[21] Appl. No.: 08/784,576

[22] Filed: Jan. 17, 1997

[51] Int. Cl.⁶ ........................................... H04B 1/10
[52] U.S. Cl. .................. 455/296; 455/126; 455/116; 455/314; 375/349
[58] Field of Search ................... 455/313–315, 455/317, 318, 323–324, 334, 337–341, 255–265, 296, 307–312, 115–116, 126; 375/261, 298, 295, 349, 316

[56] References Cited

U.S. PATENT DOCUMENTS

| | | | |
|---|---|---|---|
| 4,122,448 | 10/1978 | Martin | 342/174 |
| 4,447,792 | 5/1984 | Wynn . | |
| 4,496,912 | 1/1985 | Wynn . | |
| 4,926,443 | 5/1990 | Reich . | |
| 5,105,195 | 4/1992 | Conrad | 342/174 |
| 5,323,425 | 6/1994 | Colamonica et al. | 455/324 |
| 5,438,692 | 8/1995 | Mohindra | 455/324 |
| 5,584,068 | 12/1996 | Mohindra | 455/324 |
| 5,604,746 | 2/1997 | Oto | 455/324 |

FOREIGN PATENT DOCUMENTS

| | | |
|---|---|---|
| 0 305 602 | 3/1989 | European Pat. Off. . |
| 0 594 894 | 5/1994 | European Pat. Off. . |
| 0 739 909 | 10/1996 | European Pat. Off. . |
| 94 29948 | 12/1994 | WIPO . |

*Primary Examiner*—Doris H. To
*Attorney, Agent, or Firm*—Nixon & Vanderhye P.C.

[57] ABSTRACT

In a complex signal receiver, quadrature imbalances in phase angle and amplitude are detected and compensated. A known signal is applied to a quadrature receiver and converted into inphase and quadrature baseband signals. A signal processor determines an imbalance between the inphase and quadrature signals of the known signal and generates one or more correction factors in response to the determined imbalance. The correction factors are applied to subsequently received inphase and quadrature baseband signals to minimize the imbalance between the subsequently received inphase and quadrature baseband signals. The imbalance compensation and correction technique is also useful to quadrature transmitters that employ feedback control. The quadrature imbalance detection and correction circuitry may be integrated on the same integrated circuit chip as the receiver circuitry to provide a single, universal receiver chip.

36 Claims, 8 Drawing Sheets

| Amplitude Compensation Table | | | | | | | | | | |
|---|---|---|---|---|---|---|---|---|---|---|
| AGC Level | Temperature (°C) | | | | | | | | | |
| | -30 | -20 | -10 | 0 | 10 | 20 | 30 | 40 | 50 | 60 |
| 0 | 0.5 | 0.6 | 0.65 | 0.7 | 0.65 | 0.6 | 0.5 | 0.3 | 0.2 | 0.3 |
| 1 | 0.56 | – | – | – | – | – | – | – | – | – |
| ⋮ | ⋮ | ⋮ | ⋮ | ⋮ | ⋮ | ⋮ | ⋮ | ⋮ | ⋮ | ⋮ |
| 13 | 1.0 | 1.0 | 1.0 | 1.0 | 1.0 | 1.1 | 1.2 | 1.3 | 1.2 | 1.1 |
| 14 | – | – | – | – | – | 0.8 | 0.9 | 1.0 | 1.1 | 1.0 |
| 15 | – | – | – | – | – | – | – | – | – | – |

*Fig.8*

| Quadrature Angle Compensation Table | | | | | | | | | | |
|---|---|---|---|---|---|---|---|---|---|---|
| Channel Number | Temperature (°C) | | | | | | | | | |
| | -30 | -20 | -10 | 0 | 10 | 20 | 30 | 40 | 50 | 60 |
| 1 | 3.1 | 3.1 | 3.2 | 3.2 | 3.3 | 3.3 | – | – | – | – |
| 2 | 2.9 | 2.8 | 2.9 | 2.9 | 3.0 | – | – | – | – | – |
| ⋮ | | | | | | | | | | |
| 9 | 4.5 | 4.6 | 4.5 | 4.4 | 4.3 | – | – | – | – | – |
| 10 | – | – | – | – | – | – | – | – | – | – |

METHOD AND APPARATUS FOR COMPENSATING FOR IMBALANCES BETWEEN QUADRATURE SIGNALS

FIELD OF THE INVENTION

The present invention relates to quadrature modulation and demodulation, and more particularly, to a method and apparatus for compensating for imbalances between quadrature signals.

BACKGROUND OF THE INVENTION

In practice, its very difficult to receive a complex signal and accurately demodulate the complex signal into its inphase and quadrature components. Consider for example a radio frequency (RF) sinusoidal signal, e.g., an RF carrier. In theory, a complex receiver should be able to represent such a sinusoidal signal by its inphase, real component and its quadrature, imaginary component. The magnitude of the inphase and quadrature components should be the same, and they should always be separated by a constant 90° phase difference.

The sinusoidal signal may be defined mathematically by $v = V \cos(\omega t + \phi)$, where if the frequency $\omega$ is known, then v is specified by its magnitude V and by its phase $\phi$ in the complex domain, i.e., $v = Ve^{j\phi}$. The complex term, $e^{j\phi}$, may be expanded as $e^{j\phi} = \cos\phi + j\sin\phi$ using Euler's equation. Euler's equation reveals the ideal balance between inphase and quadrature components of a complex signal. The magnitude of both the cosine and sine terms is exactly the same, i.e., "1", and the cosine and sine terms are exactly 90° out of phase.

The difficulty is trying to achieve the theoretical—Euler's formula—in an imperfect real world. In practice, the phase difference between the inphase and quadrature components is something other than 90°, and the magnitudes of the real and imaginary components of the complex signal are not the same. As a result, a demodulated complex signal is no longer accurately represented by its inphase and quadrature components. For ease of reference, the amount by which the phase difference between the inphase and quadrature components is something other than 90° and/or the amount by which the magnitudes of the real and imaginary components of the complex signal are not the same are (is) referred to either in combination or alone as "quadrature imbalance". To date, there is has not been any satisfactory practical implementation in a radio transceiver which would detect and compensate for such undesirable quadrature imbalances.

SUMMARY OF THE INVENTION

It is an object of the present invention to detect and compensate for amplitude and/or phase quadrature imbalances.

It is a further object of the present invention to provide quadrature imbalance compensation in an economic and easily-implemented fashion.

It is a further object of the present invention to provide a universal receiver that accurately receives and I/Q demodulates complex, digitally-modulated and analog-modulated signals.

It is a further object of the present invention to provide a direct RF-to-baseband receiver that accurately quadrature demodulates a received complex signal using a quadrature imbalance compensation technique in accordance with the present invention.

It is a further object of the present invention to provide a direct RF-to-baseband receiver that can be manufactured on a single integrated circuit chip using existing IC processing techniques and readily compensated for quadrature phase and amplitude imbalances.

It is also an object of the present invention to provide a transmitter that employs an improved Cartesian feedback type quadrature modulator.

These and other objects are achieved by a novel quadrature balancing procedure. A receiver receives a quadrature signal having inphase and quadrature components. An imbalance is determined between the inphase and quadrature components. A correction factor is then generated to compensate for the determined imbalance. That correction factor is applied to subsequently received signals to reduce, and hopefully minimize, the imbalance between inphase and quadrature components. There may be a quadrature imbalance in amplitude as well as in phase. Accordingly, optimal amplitude and phase imbalance corrections are determined and then applied to subsequently received signals. Since there are various parameters and conditions that may affect such imbalances, e.g., different frequencies, gain levels, and temperatures, the correction factors may be determined for varying parameters and conditions.

In order to determine the imbalance between the inphase and quadrature components, a known signal, e.g., a known radio frequency signal in a radio receiver example embodiment, is generated by a signal generator. That known signal is received in a direct, RF-to-baseband quadrature receiver, and the known RF signal is converted into inphase baseband and quadrature baseband signals. A signal processor determines a quadrature receiver imbalance between the inphase and quadrature signals of the known RF signal.

Because the characteristics of the known RF signal are in fact "known," the signal processor detects (or otherwise determines) from the demodulated inphase and quadrature outputs corresponding to the received known RF signal the degree of quadrature imbalance in phase and amplitude between the inphase and quadrature signals. The correction factors generated as a result of the detected imbalance are then used to minimize the imbalance between subsequently received inphase and quadrature baseband signals.

A switch connects one of an antenna and the signal generator to the quadrature receiver. The signal processor controls the switch to connect the signal generator to the quadrature receiver to initialize the radio at power-up, i.e., generate the necessary correction factors. The signal processor may also later connect the signal generator to the quadrature receiver during idle time periods when the radio is not transmitting or receiving substantive information to update the correction factors if necessary. At times other than power-up or idle times, the signal processor controls the switch to connect the antenna to the quadrature receiver.

One of the determined correction factors is used to generate a quadrature control signal for controlling the quadrature angle between the inphase and quadrature signal components. Another of the correction factors is used to generate an amplitude adjustment factor to be applied to one (or both) of the inphase and quadrature components of received complex signals.

The process of generating these correction factors is preferably an iterative one. The quadrature or phase angle between the inphase and quadrature components are iteratively adjusted until a minimum imbalance signal is obtained. For example, for a particular quadrature phase angle control signal, different amplitude adjustment factors are applied to one (or both) of the inphase and quadrature components of received complex signals to determine when the imbalance reaches a first minimum value. The amplitude adjustment factor(s) is (are) optimized for each quadrature phase angle tried in the overall optimization process. The quadrature phase angle control signal is then varied, and different amplitude adjustment factors are again applied to determine when the quadrature imbalance reaches a second minimum value. This process is continued until a lowest minimum quadrature imbalance value has been obtained. It is at this lowest minimum quadrature imbalance that the correction values for quadrature phase angle and amplitude control are selected.

The present invention also relates to a radio transceiver that includes a quadrature receiver and a quadrature transmitter connected to an antenna. A signal generator generates a known RF frequency signal, and the quadrature receiver converts the known RF signal into an inphase baseband signal and a quadrature baseband signal. The signal processor determines a quadrature receiver imbalance between the inphase and quadrature signal. Based on that determined imbalance, the signal processor generates a correction factor and applies the correction factor to subsequent inphase and quadrature signals subsequently received by the quadrature receiver via the antenna to compensate for the quadrature receiver imbalance. In addition, a Cartesian/linear feedback type of quadrature modulator in the transmitter is connected to the signal processor and to the antenna. The same RF oscillator and phase splitter may be used to generate quadrature signals applied to both the quadrature modulator and the quadrature demodulator. The compensated inphase and quadrature signals are modulated by the inphase and quadrature legs of the quadrature modulator. Because the fed back inphase and quadrature signals are properly compensated to eliminate quadrature receiver imbalance, the inphase and quadrature modulator outputs are accurately generated. An example of an advantageous application is RF-to-baseband quadrature transceivers in portable and mobile radio telephones, and in particular, radio telephones that operate in both analog and digital modes—so-called "dual-mode" phones.

The universal receiver of the present invention may be implemented on a single integrated circuit chip. In addition, various imbalances and inaccuracies in the receiving circuitry and in the IC manufacturing process are readily compensated for using the present invention. In fact, IC receiver manufacturing specifications and tolerances may be "eased" because increased imbalances are compensated using the present invention. Eased manufacturing constraints facilitate mass production and reduced costs. Reduced size, i.e., a single IC chip, is also important in some radio applications such as private and public portable radios.

BRIEF DESCRIPTION OF THE DRAWINGS

These and other features of the present invention will be better and more completely understood by studying the following detailed description of the presently preferred embodiments together with the appended drawings of which.

DETAILED DESCRIPTION OF THE INVENTION

In the following description, for purposes of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention with unnecessary detail.

Recalling Euler's formula set forth above, the accuracy of a complex signal receiver very much depends upon the receiver's ability to generate inphase and quadrature RF carrier signals, (i.e., at the RF channel currently being received), at the same amplitude and which are separated by exactly 90°, i.e., which are in exact "quadrature." The inphase and quadrature RF carrier signals are applied to respective mixers to frequency down-convert a received RF signal into inphase and quadrature components. For purposes of description and not limitation, this frequency down-conversion from a received complex signal to inphase and quadrature components is referred to as "demodulation" even though the inphase and quadrature signals may well undergo further demodulation.

If the amplitude of the inphase carrier is different than the amplitude of the quadrature carrier, a quadrature imbalance is created in the demodulated inphase and quadrature signals. Similarly, a quadrature imbalance is generated if the inphase and quadrature carrier signals are not separated by exactly 90°. Quadrature imbalances may also be generated by filtering and other signal processing elements in the receiver circuitry, e.g., automatic gain controllers, etc. A consequence of the imbalance is the generation of spurious signals in the demodulated signal.

One solution to this quadrature imbalance problem is to employ extremely accurate phase splitters, mixers, filters, and other receiving circuitry. However, this is often impractical either in terms of cost or in terms of technical infeasibility. An example of technical infeasibility is found in the manufacture of receiving circuitry as part of integrated circuits. IC circuits are currently not manufactured with the necessary degree of precision and accuracy to prevent these imbalances especially at higher RF frequencies.

Because practical integrated circuit processing techniques are not capable of adequately controlling this imbalance, analog quadrature receivers are normally not used in practice. Moreover, while digital quadrature receivers are employed, their performance is decreased by the above-described quadrature imbalances. By detecting and correcting these imbalances, the present invention opens up new opportunities for complex signal receivers in both the analog and digital domains.

In order to compensate for quadrature imbalances, those imbalances must first be accurately detected. Referring to the complex receiver 10 to FIG. 1, a signal generator 18 generates a known radio frequency signal. The term "known" is used in its broadest sense in that it may refer to any useful signal characteristic that is known including for example frequency, phase, modulation, etc. The known signal is provided to a switch 14 which is controlled by the signal processor 20 to select the input provided to a direct RF-to-baseband quadrature receiver or demodulator 16. Although direct RF-to-baseband demodulation is preferred because less receiving circuitry is needed, i.e., IF mixers, filters, etc. are eliminated, the present invention is not limited to direct RF-to-baseband type receivers. For example, the present invention can be used as a direct IF-to-baseband quadrature receiver. The main function of the quadrature receiver 16 is to convert the received RF signal (a complex signal) into inphase (I) and quadrature (Q) signals. Additional demodulation, decoding, and other processing of the baseband signals may be and is often desirable in order to extract the desired information from the received signal. Such additional processing is performed for example on the baseband output signal from signal processor 20.

Figure 1:
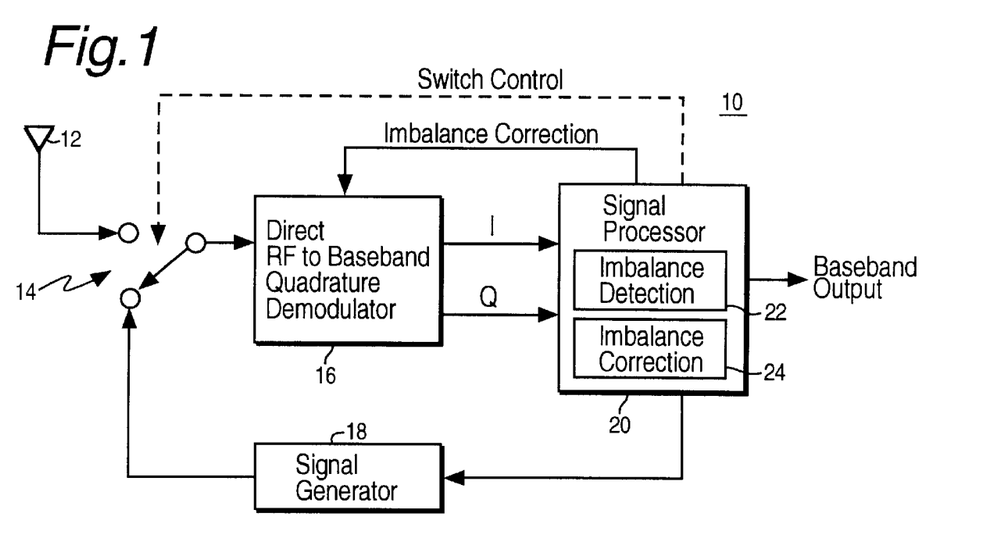
FIG. 1 is a function block diagram of a radio receiver in accordance with the present invention.

The inphase and quadrature outputs from the quadrature receiver 16 are processed by signal processor 20 which performs an imbalance detection task 22 and then an imbalance correction task 24. The signal processor also generates a switch control signal to control the switch 14. Initially, the signal processor generates a switch control signal to control switch 24 to select the known output of signal generator 18 for input to the quadrature demodulator 16. Of course, those skilled in the art will appreciate that while each of the switch 14, quadrature receiver 16, signal generator 18, and signal processor 20 have been shown as separate function blocks, all of these components are preferably manufactured as and incorporated onto a single integrated circuit chip using existing mass production, IC manufacturing techniques without a need to employ more accurate (if technically feasible) and costly procedures.

A single IC chip receiver is a significant advantage particularly in portable/mobile telephony in terms of reduced size/space requirements and cost. In contrast to the direct RF-to-baseband receiver used in the present invention, most radio receivers require frequency conversion to intermediate frequencies (IF's)—hereafter an IF receiver. IF receivers suffer from reception of spurious image signals and require very narrow IF filters in order to achieve necessary adjacent channel selectivity. These IF filters are relatively expensive and are very difficult to integrate into an integrated circuit chip. Similarly, IF receivers require one or more frequency sources for the IF mixer along with additional IF circuitry which are not easily integrated and which add cost and complexity. Still further, additional frequency sources also may increase the risk of internal mixing products that "self-quiet" the IF receiver without a receive signal present. None of these issues are problems with the direct-to-baseband approach of the present invention. For example, the selectivity of direct-to-baseband receivers is determined by filters following the mixers which are easily integrated onto a single IC chip and possess much greater selectivity than IF filters. Moreover, direct-to-baseband receivers inherently have no image mixing.

Figure 2:
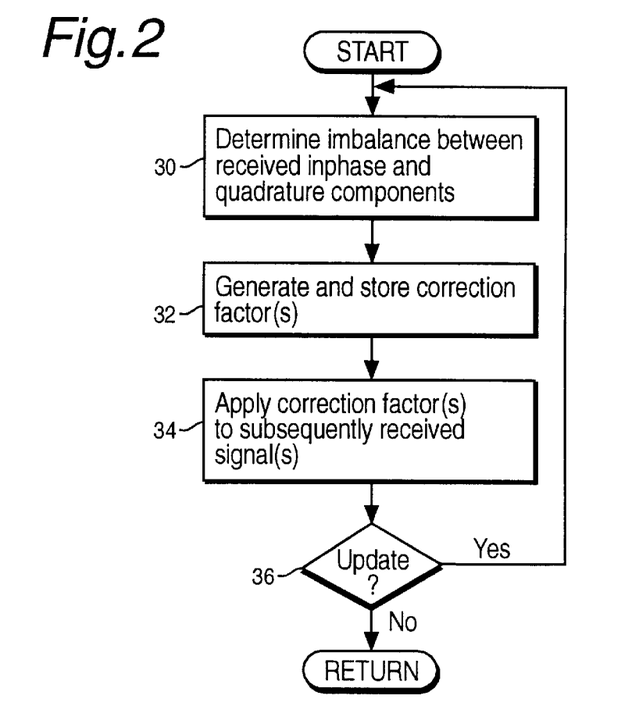
FIG. 2 is a flowchart diagram illustrating the procedures for balancing the radio receiver shown in FIG. 1.

The operation of the radio receiver 10 shown in FIG. 1 is described in conjunction with the flowchart diagram shown in FIG. 2. The imbalance detection task 22 executed by signal processor 20 first determines a quadrature imbalance between received and inphase quadrature components generated when the known signal produced by signal generator 18 is demodulated in block 16 (block 30). To determine the quadrature imbalance, signal generator 18 is connected via switch 14 to the quadrature receiver 16. Once the quadrature imbalance is detected, the imbalance correction task 24 executed by signal processor 20 generates and stores in memory one or more correction factors (block 32). Those correction factors are applied to subsequently received signals. While FIG. 1 shows a quadrature imbalance correction signal provided to the quadrature receiver 16, those skilled in the art will appreciate that the imbalance correction may be implemented in a number of different fashions.

Once the correction factors are calculated and stored, the switch control signal from signal processor 20 may actuate the switch 14 so that antenna 12 is now connected to the quadrature demodulator 16 for normal operation. It may be desirable to periodically update the quadrature imbalance correction factors as indicated in decision block 36 in FIG. 2. For example, certain parameters of the radio or environmental conditions may change making such update process either necessary or at least desirable. One example of a changing environmental condition that may affect imbalance correction is temperature.

Figure 3:
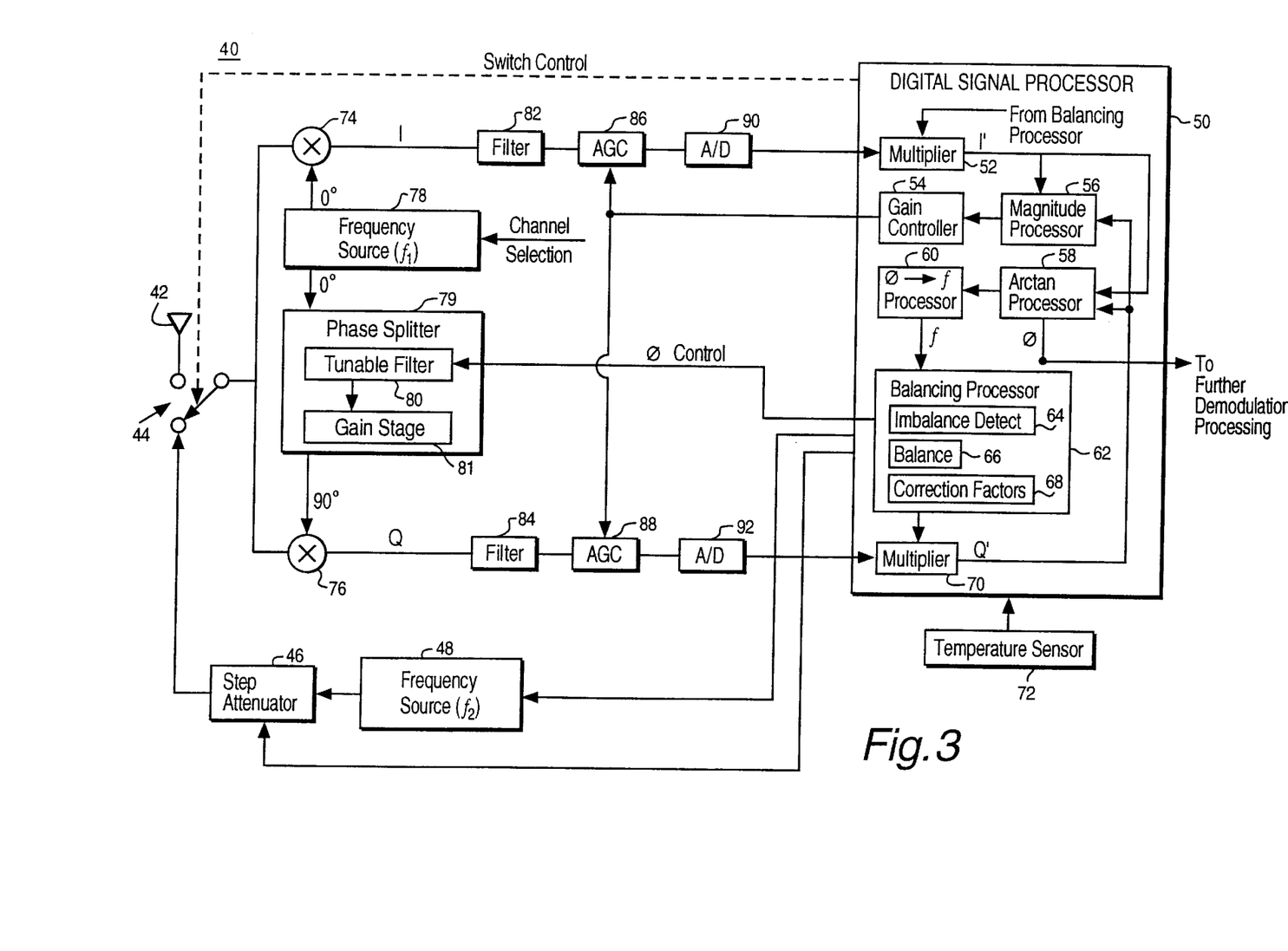
FIG. 3 is a function block diagram of a radio receiver in accordance with a preferred, example, and non-limiting embodiment of the present invention.

An example, non-limiting, preferred implementation of the present invention is now described in conjunction with FIGS. 3–9. FIG. 3 is a function block diagram of a radio receiver 40 including an antenna 42 connected via switch 44 to inphase mixer 74 and quadrature mixer 76. The other inputs to the mixers 74 and 76 are quadrature RF carriers generated by frequency source 78 at the particular receiving frequency channel of interest (represented as frequency $f_1$). A channel selection signal to the frequency source may be generated for example by digital signal processor 50. Frequency source 78 may be for example a digitally controlled frequency synthesizer, a voltage controlled oscillator, etc. The output of inphase mixer 74 is an inphase baseband signal which is filtered in a filter 82. The filtered output is processed by an adaptive gain controller 86. The output of the adaptive gain controller is converted into digital format by way of analog-to-digital converter 90 for further processing by the digital signal processor 50. Filtering and adaptive gain control are commonly used in radio receivers and therefore are not described in detail here.

The selected carrier frequency $f_1$ generated by frequency source 78 is also input to a phase splitter 79 which may include for example a tunable filter 80 connected to a gain stage 82. The output of phase splitter 79 is a quadrature carrier signal which is theoretically 90° out-of-phase with the carrier signal provided to the inphase mixer 74. The quadrature mixer 76 converts the received signal into a quadrature baseband signal which is then filtered in filter 84, adaptively gain-controlled in AGC stage 88, and digitized in analog-to-digital converter 90 before being provided to the digital signal processor 50.

Frequency source 48 is also connected to the inphase and quadrature mixers 74 and 76, respectively, by way of step attenuator 46 and switch 44. The switch control signal generated by digital signal processor 50 controls whether the antenna 42 or the frequency source 48 is connected to the mixers 74 and 76. Frequency source 48 generates a radio frequency signal having a frequency $f_2$ different from the carrier frequency $f_1$ generated by frequency source 78. For example, if the s frequency $f_1$ is on the order of 800 mHz, an example frequency difference or deviation between $f_1$ and $f_2$ may be 3 kHz. Of course, other frequency deviations may be used. As will be described in further detail below, this frequency difference/deviation is used by the digital signal processor 50 to detect quadrature imbalances between the inphase and quadrature baseband signals. As with frequency source 78, frequency source 48 may be any suitable frequency generator such as a digitally controlled frequency synthesizer, voltage controlled oscillator, etc. Digital signal processor 50 generates a signal to control frequency source 48 to maintain a constant frequency deviation between $f_1$ and $f_2$. Thus, if the received channel selection changes to a different frequency $f_1$, a control signal is generated by the digital signal processor 50 to frequency source 48 to adjust the frequency $f_2$ to be offset 3 kHz from the new channel selection frequency $f_1$ either constantly or via means of a modulated signal.

Digital signal processor 50 includes inphase and quadrature multipliers 52 and 70, respectively, for receiving the inphase and quadrature digitized signal generated by analog-to-digital convertors 90 and 92, respectively. While dedicated multipliers 52 and 70 for inphase and quadrature components are shown, those skilled in the art will appreciate that only one multiplier need be provided to adjust the amplitude of one of the inphase and quadrature components by using an appropriate multiplying factor (either greater or less than 1) to achieve amplitude balance between the inphase and quadrature signals. Multipliers 52 and 70 are connected to a magnitude processor 56 which calculates the magnitude of the received complex signal by, for example, taking the square root of the sum of the squares of the I and Q outputs of multipliers 52 and 70, respectively. Those skilled in the art will appreciate that the various function blocks shown in digital signal processor 50 are provided for illustration purposes and may be implemented in practice using digital signal processing hardware circuitry, by suitably programmed microprocessor(s), or other data processing technique(s). The magnitude of the complex signal determined by magnitude processor 56 is used by gain controller 54 to generate gain control signals that regulate the AGCs 86 and 88. The AGCs 86 and 88 are controlled to adapt the signal level of the inphase and quadrature baseband signals to a level that is optimal for the range of the analog-to-digital converters 90 and 92.

The multiplier inphase baseband signal (I') and quadrature baseband (Q') signal are also processed by an arctangent processor 58. The arctangent processor 58 calculates the phase of the received complex signal in accordance with the well known trigonomic principles, i.e., the received actual quadrature phase angle $\phi=\tan^{-1}(Q/I)$. The phase angle $\phi$ determined by the arctangent processor 58 represents the baseband information which then may be further processed to extract the desired information, e.g., digital symbols, analog, audio, etc. The phase angle output $\phi$ of arctangent processor 58 is also provided to a phase-to-frequency processor 60 which converts the phase angle $\phi$ into a frequency by, for example, taking the derivative of the phase with respect to time. Of course, the frequency generated by the phase-to-frequency processor 60 may also be used to represent the demodulated signal and would, in that event, also be further processed to extract the desired information.

One of the tasks performed by the balancing processor 62 is the imbalance detection task 64. A variety of different techniques may be employed to detect the quadrature imbalance between the I and Q baseband signals. The present invention in a non-limiting preferred embodiment uses the demodulated frequency from the phase-to-frequency processor 60 to detect the quadrature imbalance between the inphase and baseband signals. Balance task 66 uses the detected imbalance and generates one or more correction factors 68 which are then stored in memory and later used to correct quadrature imbalances of subsequently received signals via antenna 42. Specifically, a quadrature phase angle control signal ($\phi$ control) generated by balancing processor 62 is used to control the tunable filter 80 in the phase splitter 79. Any other technique for regulating the quadrature phase angle output of phase splitter 79 could also be employed. In addition, balancing processor 62 generates a multiplier factor that may be applied to one or both of multipliers 52 and 70 for compensating for amplitude imbalances between the inphase and baseband signals.

The operation of the radio receiver in accordance with the preferred example embodiment shown in FIG. 3 will now be described. As in the more general embodiment shown in FIG. 1, a known signal (which can be thought of as a test or training signal) is generated by frequency source 48 at a different frequency $f_2$ than the frequency $f_1$ generated by frequency source 71. Digital signal processor 50 generates the switch control signal so that switch 44 selects the output from step attenuator 46. As mentioned above, the digital signal processor 50 controls the frequency source 48 to ensure that a known frequency difference, for example 3 kHz, is maintained between $f_1$ and $f_2$. Of course, other differences may be provided between $f_1$ and $f_2$, e.g., a known signal modulated onto carrier $f_2$. The frequency difference is used to detect the quadrature imbalance between the baseband, inphase, and quadrature signals.

Depending upon the level of sophistication and the variety of parameters to be handled by the receiver, the step attenuator 40 may be optionally employed (as it is in the preferred embodiment) when automatic gain control is employed. The step attenuator 46 is controlled by an output signal from digital signal processor 50 during the imbalance detection and calculation of imbalance correction factor processes carried out for multiple gain levels. The step attenuator 46 ensures that the signal level output of frequency source 48 is at the optimum signal level to be processed by one or both of the AGCs 86, 88, and A-to-D convertors 90 and 92.

For example, in a given radio implementation, the radio receiver may receive input signals that vary by 100 dB or more. Accordingly, the AGCs must also function over this same dB range. Because a relatively constant signal magnitude is desired for proper operation of the analog to digital converters, each AGC gain stage/step must be compensated over the full dynamic range. Rather than provide an attenuation step for each AGC stage, it is simpler to provide fewer attenuation steps and allow the input signals to the analog-to-digital converters to vary over a number of levels. Of course, this is an implementation detail which may be readily varied depending upon design goals of the receiver.

Figure 4:
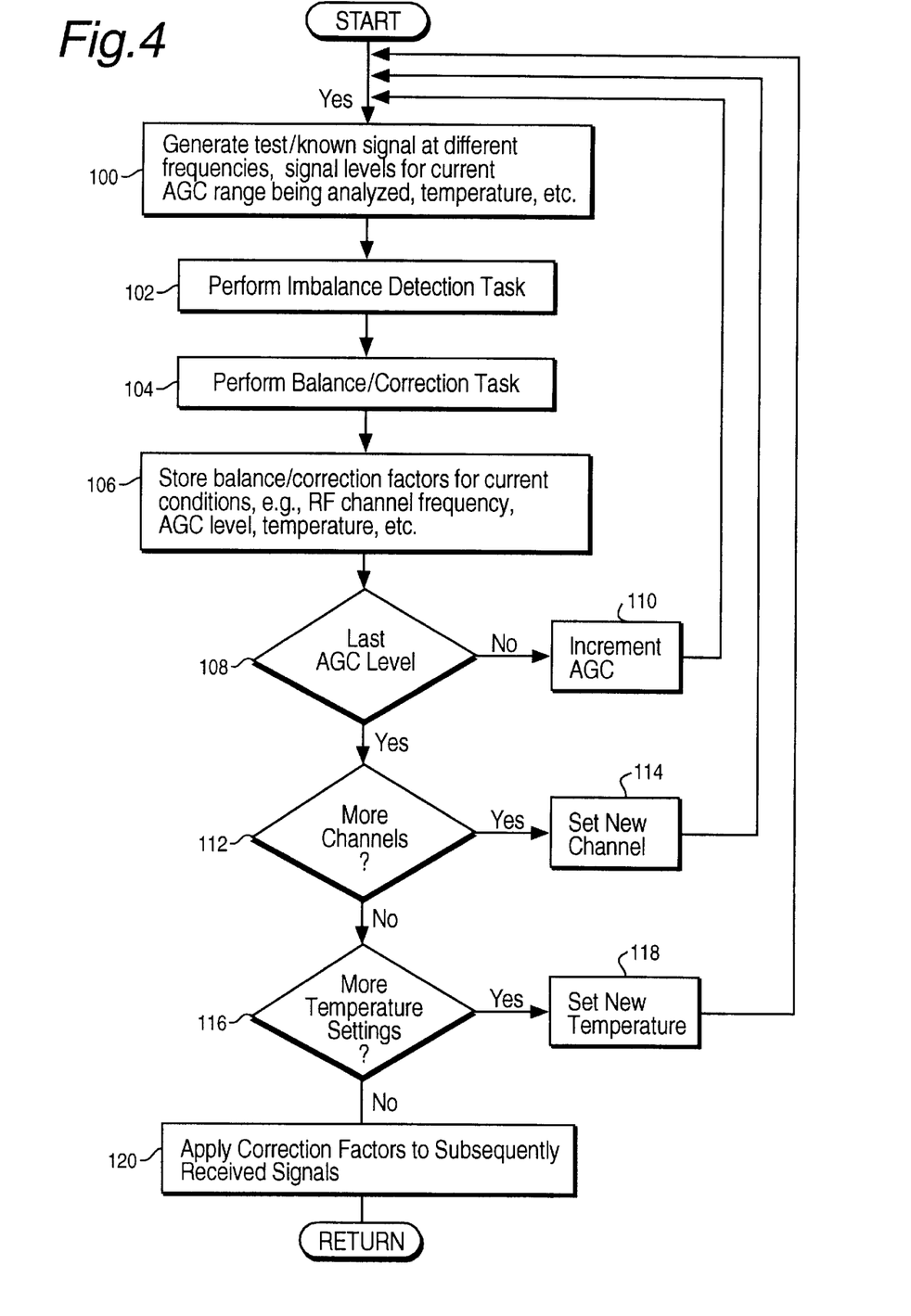
FIG. 4 is a flowchart diagram illustrating procedures performed by the digital signal processor 50 in accordance with the receiver balancing procedures of the present invention of FIG. 3.

Reference is now made to the flowchart in FIG. 4 that outlines the overall operation of the complex receiver 40 shown in FIG. 3. A known frequency signal at the appropriate signal level is demodulated by the direct RF-to-baseband circuitry. The preferred, example embodiment generates correction factors for the complex receiver 40 at different channel frequencies, signal levels for various AGC ranges, temperatures, and any other variable or parameter that might impact the quadrature phase or amplitude imbalance (block 100). Each known signal received under certain parameters and/or conditions is demodulated, and the resulting inphase and quadrature signals are processed by the digital signal processor 50. The balancing processor receives the resulting frequency output from phase-to-frequency processor 60 and performs an imbalance detection task (block 102).

Figure 5:
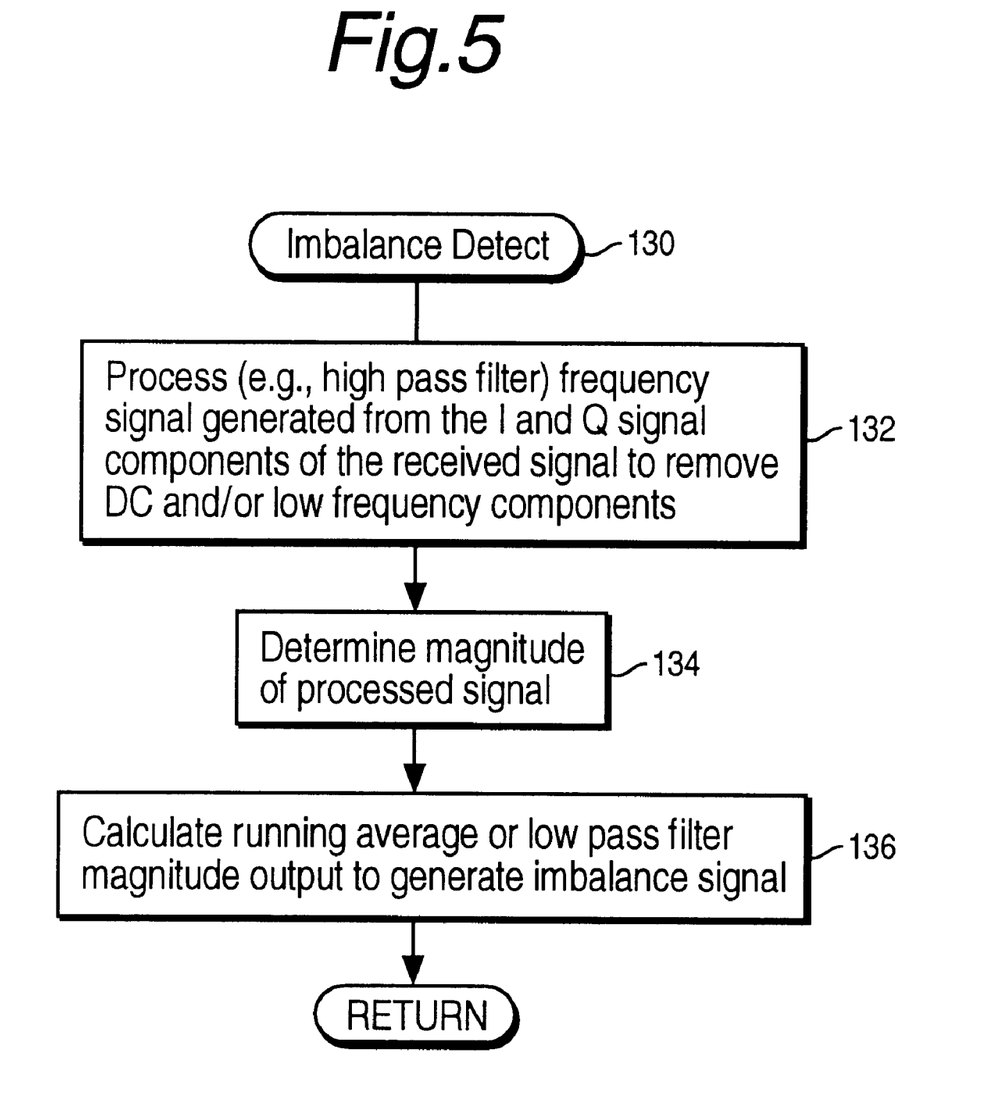
FIG. 5 is a flowchart diagram illustrating imbalance detection procedures performed by the balancing processor 62 in the example embodiment of the present invention of FIG. 3.

The imbalance detect task routine 130 as shown in FIG. 5 processes the frequency output signal from the phase-to-frequency processor 60 to remove DC and/or low frequency components (block 132). Such processing is in many ways analogous to a high pass filter operation. Processing of a frequency signal is particularly effective in determining quadrature imbalance when there is a difference in frequency between the received signal, here the known frequency source $f_2$, and the carrier frequency of the received channel, $f_1$. The effect of a quadrature imbalance is to cause the arctangent processor 58 to create spurious signals at twice the difference or deviation frequency. If the frequency difference between $f_1$ and $f_2$ is 3 kHz, then the quadrature imbalance corresponds to and is localized at the signal energy generated at 6 kHz. Because of such localization, the quadrature imbalance is readily detected and its value easily monitored for increases and decreases. In effect, step 132 removes the DC and lower frequency signal energy components which represent the 3 kHz deviation without any imbalance. As a result, only the quadrature imbalance signal concentrated at twice the deviation frequency, e.g., 6 kHz in this example, remain. Once the frequency imbalance signal is isolated, its magnitude is determined (block 134). To provide a more reliable imbalance signal, an optional running average or low pass filtering operation may be performed on the magnitude signals (block 136) to generate the quadrature imbalance signal.

Having detected and isolated the imbalance signal, control returns to block 104 in FIG. 4 where the balancing processor 62 performs a balance task 66. For example, balance task 140 shown in FIG. 6 in flowchart format is preferably an iterative process that adjusts the quadrature phase angle control signal (which controls the amount of phase angle added to frequency $f_1$ from frequency source 78 to generate the quadrature carrier) and the amplitude correction factor applied to one or both of the inphase and quadrature multipliers 52 and 70, respectively. The goal of this iterative process is to independently adjust one of the quadrature imbalance correction factors to determine whether the change in the correction factor increases or decreases the quadrature imbalance signal. If the change in a correction factor increases the imbalance signal, the change is assumed to have been in the "wrong" direction, and a change in the opposite polarity or other direction is tried. This process is continued in an iterative fashion until a minimum imbalance signal is detected. The quadrature phase angle and amplitude correction factors which produce the minimum imbalance procedure are adopted as correction factors and stored at 68. Of course, other minimum error seeking algorithms could also be used, e.g., the least means squares (LMS) algorithm, etc.

A quadrature phase angle increment $\Delta Q$ is added to the current quadrature phase angle control correction factor provided to the tunable filter 80 of the phase splitter 79 (block 142). A minimum amplitude imbalance (MAI) task is then performed (block 144) as outlined in the flowchart in FIG. 7. The minimum imbalance routine 160 adds a quadrature amplitude increment $\Delta A$ to the amplitude control signal (s) provided to one or both of the multipliers 52 and 70 (block 162). The balancing processor 62 performs the imbalance detect task 130 (from FIG. 5) to determine a new imbalance signal (IS) level (block 164). A decision is made in block 166 whether the newly calculated imbalance signal level is greater than the old, prior imbalance signal level. If so, it is the increment in the amplitude control signal was in the "wrong" direction having increased the quadrature imbalance rather than decreased it. As a result, a new amplitude increment $\Delta A$ (new) is calculated in the opposite direction. For example, $\Delta A$ (new) can be set equal to $\{-(\Delta A[\text{old}])/2)\}$ (block 168). On the other hand, if the new imbalance signal is less than or equal to the old imbalance signal, the old imbalance signal is replaced with the new imbalance signal (block 170). A decision is then made in decision block 172 whether the magnitude of the amplitude increment is less than a threshold. In other words, this step determines whether the incremental changes to improve the calculated imbalance signal have become sufficiently small so as to have reasonably approached a minimum. If so, control returns to the balance routine 140 in FIG. 6. If not, control returns to block 162 in an attempt to further minimize the imbalance signal.

Figure 6:
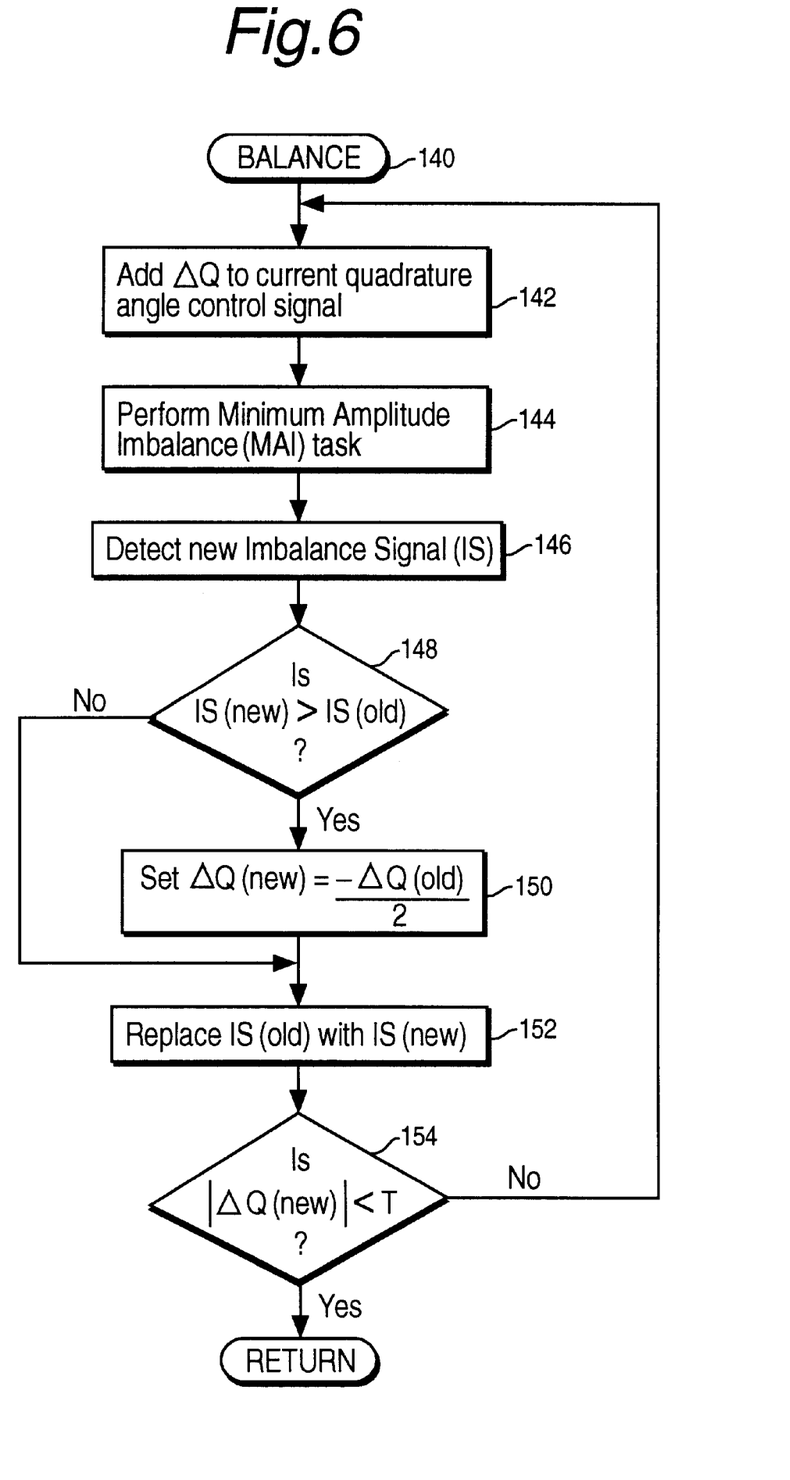
FIG. 6 is a flowchart diagram of a balancing procedure performed by the balancing processor 62 in the example embodiment of the present invention shown in FIG. 3.

In returning to the balance routine 140 at block 144, the amplitude correction factors have been optimized for the current quadrature phase angle control correction factor. However, the quadrature angle control correction factor itself needs to be optimized. Accordingly, a new quadrature imbalance signal is detected in block 146 with the quadrature angle control correction factor and amplitude control correction factor as currently calculated. A decision is made in block 148 whether the newly calculated quadrature imbalance signal is greater than the old existing quadrature imbalance signal. If so, the quadrature phase angle correction factor increment was moved in the "wrong" direction. As with the minimum amplitude imbalance routine, a new quadrature phase angle correction factor increment is set in the opposite direction in accordance with the equation $\Delta Q$ (new)=–[$\Delta Q$ (old)/2] (block 150). If the new imbalance signal is less than or equal to the old imbalance signal, the old imbalance signal is replaced with the new imbalance signal (block 152). A decision is made in block 154 whether the magnitude of the quadrature phase angle correction factor increment $\Delta Q$ is less than a threshold (T). If it is, control returns to the main routine in FIG. 4. Otherwise, the increment $\Delta Q$ (new) is added to the current quadrature phase angle correction factor in block 142, and the balance routine is repeated.

Figure 7:
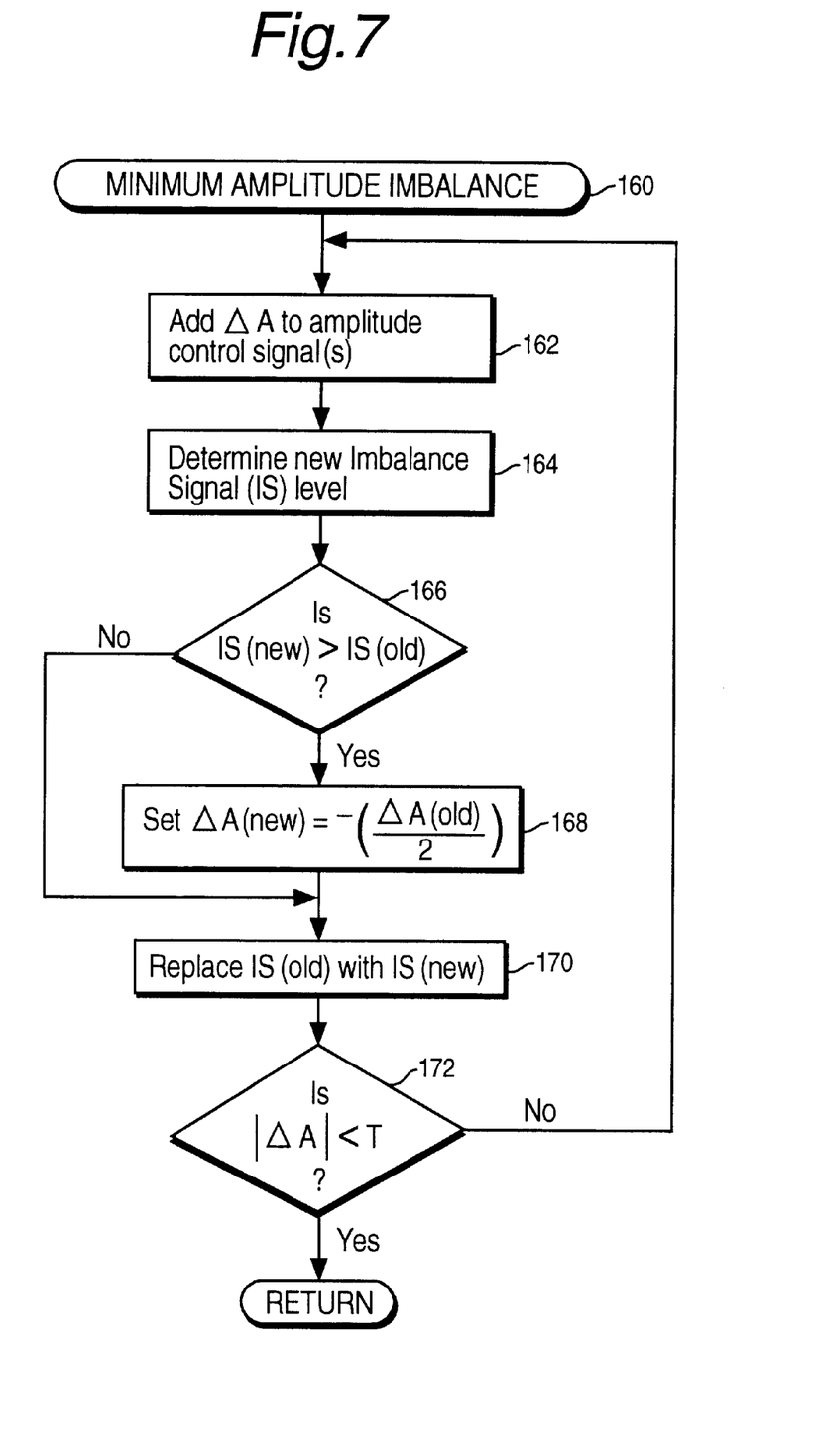
FIG. 7 is a flowchart diagram of a minimum amplitude imbalance procedure employed in the balancing procedures outlined in FIG. 6.

The procedures outlined in FIGS. 6 and 7 are iteratively repeated until the minimum quadrature and amplitude step size has been reached or the quadrature imbalance signal is reduced to a minimum value. The quadrature phase angle correction factor and amplitude correction factor(s) that achieve this minimum imbalance signal are then stored in memory 68 for use by the balancing processor at memory 62 on subsequently received signals.

As mentioned above, there may be several different parameters and/or conditions for which the correction factors must be calculated to ensure that the quadrature imbalance is appropriate for the current receiver parameters and/or conditions. For example, receiver parameters AGC level and received frequency $f_1$ as well as the environmental condition of temperature affect the balancing task. Therefore, balance correction factors need to be determined and stored for these varying conditions and parameters.

Decision block 108 determines whether quadrature imbalance correction factors have been calculated for each of multiple automatic gain control (AGC) levels. If not, the next AGC level is set (block 110) via an output from gain controller 54 to AGCs 86 and 88 and the process outlined in steps (100–106) is repeated. Decision block 112 determines whether there are any additional receive channel frequencies to be tested. For the particular parameter of frequency, one can optionally assume that amplitude of the inphase and quadrature baseband signals will not be significantly affected by changes in frequency. Therefore, only the phase imbalances need be corrected. If there are more channels to test, the next new channel is set (block 114) by channel selection signal to frequency source 78. Accordingly, the known signal frequency source 48 is also changed to ensure that the offset between $f_1$ and $f_2$ remains the same. Control then returns to repeat the procedures outlined above in conjunction with steps 100–106.

An example of a variable condition in which the radio operates is temperature. Decision block 116 determines whether there are other temperature settings for which compensation factors could be calculated. For example, ten different temperature settings could be set at 10° C. increments. A new temperature is set (block 118), and the control procedures outlined above in conjunction with steps 100–106 are repeated.

Additional parameters and/or conditions may of course be taken into account with AGC level, frequency, and temperature being only examples. Once the correction factors have been determined and optimized for various conditions and parameters, they are stored in correction factor memory 68. The digital signal processor then switches the switch 44 to select the antenna 42. The correction factors in the form of a quadrature control signal applied to the tunable filter 80 in phase splitter 79 and a multiplier factor applied to one or both multipliers 52 and 70 are then retrieved from correction factor memory 68 based on the current radio parameters being used and/or conditions experienced. Those appropriate correction factors are applied to compensate subsequently received signals for quadrature imbalance (block 120).

Figure 8:
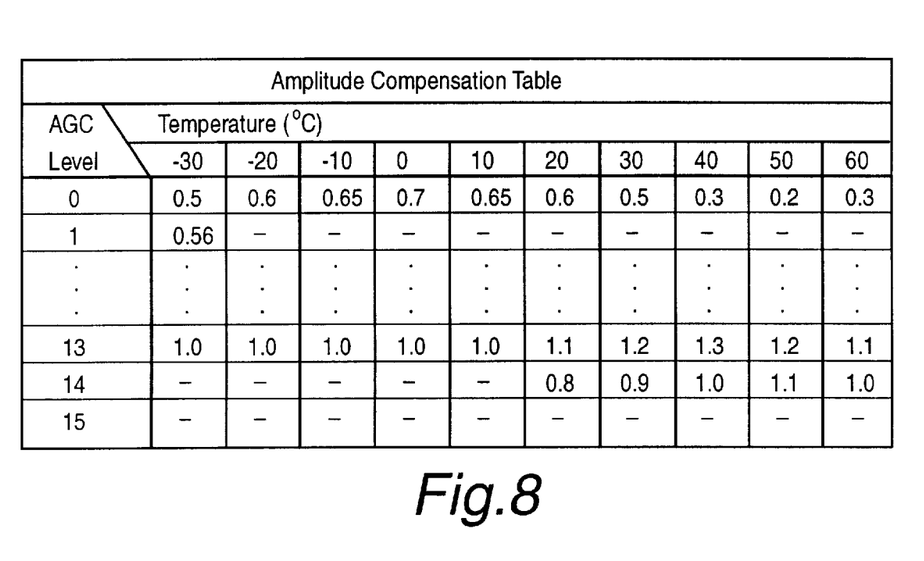
FIG. 8 shows an example amplitude compensation table.
Figure 9:
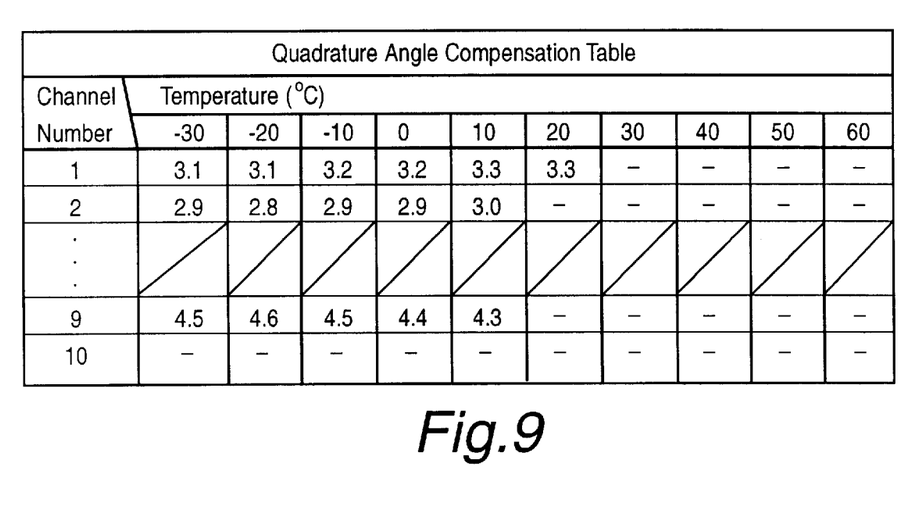
FIG. 9 shows an example quadrature phase angle compensation table.

The correction factors can be stored in conventional table lookup format. FIGS. 8 and 9 show some example lookup tables. In particular, FIG. 8 shows an amplitude compensation table that assumes sixteen different automatic gain control (AGC) levels (0–15) and ten different temperatures (−30° C.–60° C.). Each AGC level and temperature has a corresponding amplitude correction factor.

FIG. 9 shows an example of a quadrature phase angle compensation table. As noted above, changes in frequency are optionally assumed to only affect the quadrature phase angle between the inphase and quadrature baseband components. Assuming that there are ten different frequency channels to be received by the radio receiver 40, (in reality a much larger number of channels may be employed), phase angle correction factors for ten different temperatures (−30° C.–60° C.) at each frequency are calculated and stored.

For subsequently received signals, the balancing processor 62 accesses the appropriate amplitude correction factor from the amplitude compensation table using the appropriate AGC level and temperature. That correction factor is then applied to one of the multipliers 52 and 70. Similarly, the balancing processor 62 retrieves the appropriate quadrature phase angle correction factor from the lookup table using the currently tuned channel number and temperature. The phase angle correction factor is then applied to the tunable filter 80 of phase splitter 79.

Although the preferred example embodiment takes into account a number of different parameters and conditions, those skilled in the art will appreciate that a much more simplified version of the present invention may be implemented. For example, temperature can be assumed to be constant, and a fewer number of AGC levels (if any) may be employed. In addition, while the imbalance detection and correction factor determination processes described above normally may occur at power-up of the radio or at other suitable startup times, the present invention may also be employed to update correction factors during idle time periods while the radio is powered on. Such idle time periods may be detected by the digital signal processor 50 and used to control switch 44 to select the known signal from frequency source 48.

Thus, the present invention provides a number of improvements and advantages. In terms of practical manufacture, a direct RF-to-baseband radio receiver in accordance with the present invention can be readily integrated onto a single IC chip and therefore does not require a large number of external components. This reduces cost, complexity, and size/space. Equally important, the present invention provides accurate complex demodulation which is critical for complex analog radio receivers and important for digital radio receivers. Because imbalances are accurately corrected, receiver IC manufacturing may be relaxed to simplify manufacture and reduce cost. As compared to typical heterodyne radio receivers, the present invention provides superior channel selectivity with little or no spurious image signals, and eliminates the "self-quieting" problem. The RF-to-baseband type receiver in accordance with the present invention also provides greater broadband frequency coverage as compared to typical heterodyne radio receivers. Further advantages of the present invention include the fact that the present invention provides for demodulation with respect to all forms of modulation techniques, and uses digital signal processors only at baseband frequencies. Multiple bandwidth channels may be easily received (including higher frequency bands), which allows for design of multiple band radios.

Figure 10:
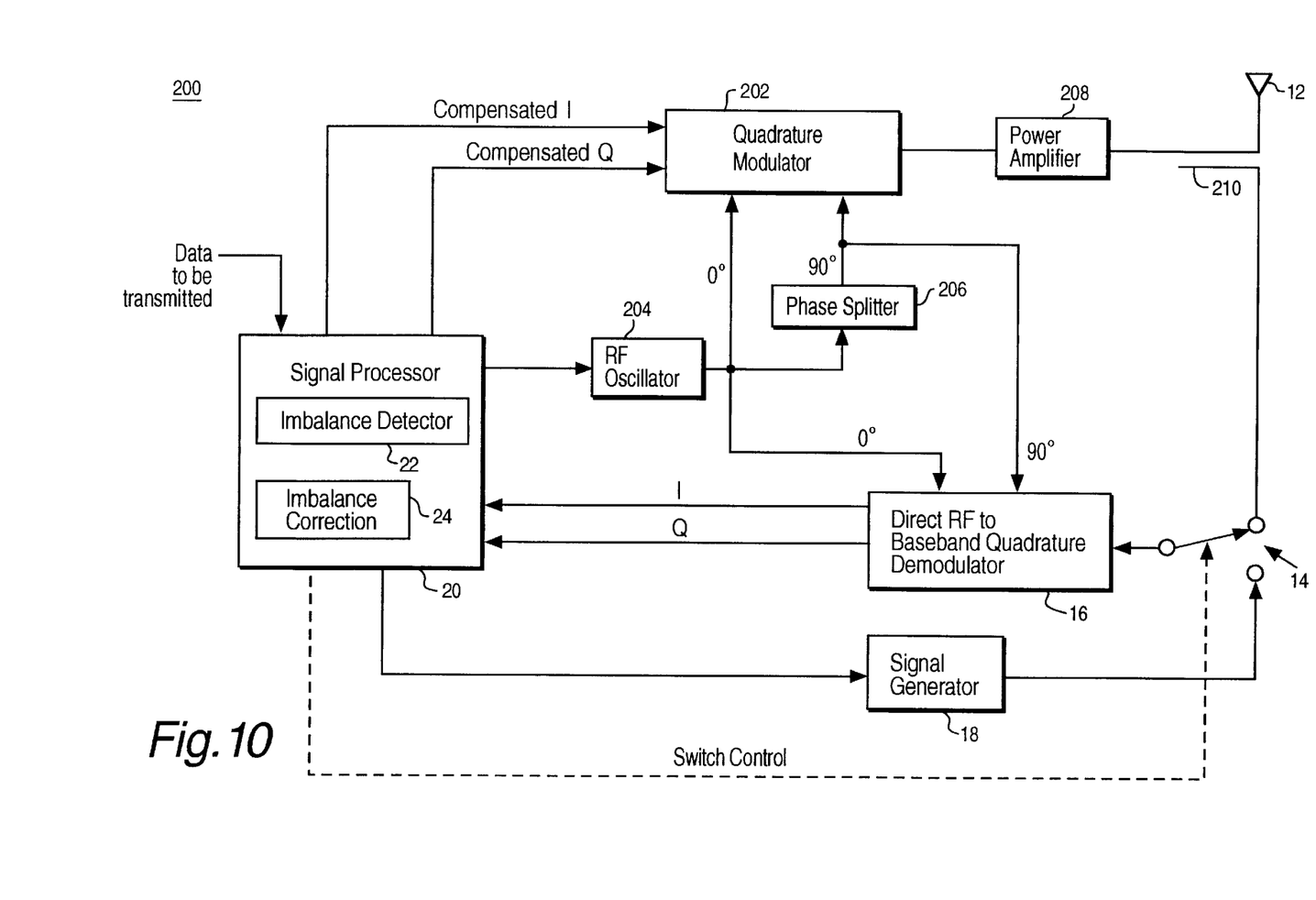
FIG. 10 shows a function block diagram of another example embodiment of the present invention employed in a radio transceiver.

Another application of the present invention is to transceivers in general, and in particular, to transmitters having complex signal modulators that employ Cartesian feedback linearization. FIG. 10 shows a transceiver 200 in which the present invention may be advantageously employed. One of the shortcomings of a complex transmitter that employs Cartesian feedback linearization is that the feedback is assumed to be an accurate representation of what was actually transmitted. However, the feedback loop requires a complex signal demodulation to recover the transmitted inphase and quadrature baseband signals. Accordingly, the quadrature demodulator in the feedback loop suffers from the same quadrature imbalances as noted above. However, the receiving circuitry in the feedback loop may also advantageously be compensated for quadrature imbalances to thereby provide more accurate inphase and quadrature baseband signals fed back to the complex signal modulator.

Radio transceiver 200 includes a complex quadrature modulator 202 that receives inphase (I) and quadrature (Q) feedback signals from signal processor 20 (like reference numerals referring to like elements in the drawings). The signal processor 20 controls a radio frequency (RF) oscillator 204 which generates an RF carrier signal upon which the inphase and quadrature signals are modulated to generate the complex signal output by the quadrature modulator 202, amplified in power amplifier 208, and transmitted via antenna 12. The output of RF oscillator 204 is fed directly to the quadrature modulator 202 and to phase splitter 206 which generates the quadrature carrier also provided to quadrature modulator 202. Advantageously, the same RF oscillator 204 and phase splitter 206 provide the quadrature carriers to the direct RF-to-baseband quadrature demodulator 16 described above. A directional coupler 210 detects the transmitted signal and feeds it back to switch 14. The operation of switch 14 is controlled as described above by a switch control signal generated by signal processor 20. In normal feedback operation, switch 14 selects the directional coupler. However, in order to detect the quadrature imbalances as noted above, switch 14 selects the known signal generated by signal generator 18 for connection to the RF to baseband quadrature receiver 16. The quadrature imbalance detector 22 detects the quadrature imbalances as described above. The quadrature imbalance correction factors are then corrected and applied to subsequently received inphase and quadrature baseband signals via the directional coupler to generate the compensated inphase and quadrature signals fed to quadrature modulator 202.

Although Cartesian feedback compensation may occur in the signal processor 20, this comparison may also be performed using external hardware with the desired I and Q signals being supplied by the signal processor 20 or other hardware.

While the present invention has been described with what is presently considered to be the most practical and preferred embodiments, it is to be understood that the appended claims are not to be limited to the disclosed embodiments. On the contrary, the appended claims are intended to cover all modifications, variations, and/or equivalent arrangements in keeping with the spirit of this invention.

What is claimed is:

1. A method for balancing a complex signal transceiver, comprising:

receiving a first complex signal;

separating the first complex signal into first inphase and quadrature components processing the first inphase and quadrature components and determining an imbalance between the first inphase and quadrature components;

generating a correction factor based on the determined imbalance including:

generating a quadrature control signal for controlling separation of complex signals into inphase and quadrature components, generating amplitude factors to be applied to one of the inphase and quadrature components of received complex signals, and alternately and iteratively varying one of the quadrature control signal and one of the amplitude adjustment factors until a minimum imbalance signal is obtained, receiving a second complex signal;

separating the second complex signal into second inphase and quadrature components; and balancing the second inphase and quadrature components using the correction factor.

2. The method in claim 1, wherein the determined imbalance includes imbalances in amplitude and phase between the first inphase and quadrature components.

3. The method in claim 1, wherein the correction factor includes an amplitude correction and a phase correction.

4. The method in claim 3, wherein amplitude and phase corrections are determined for different temperatures.

5. The method in claim 1, further comprising the step of:

for a particular quadrature control signal, applying different amplitude adjustment factors to determine when the determined imbalance reaches a first minimum value.

6. The method in claim 5, further comprising:

varying the quadrature control signal, and repeating the applying step to determine a second minimum value for the determined imbalance, and selecting the quadrature control signal and amplitude adjustment factors that produce the lowest minimum imbalance.

7. A method for balancing a complex signal transceiver, comprising:

receiving a first complex signal;

separating the first complex signal into first inphase and quadrature components;

processing the first inphase and quadrature components and determining an imbalance between the first inphase and quadrature components;

generating a correction factor based on the determined imbalance;

receiving a second complex signal;

separating the second complex signal into second inphase and quadrature components; and balancing the second inphase and quadrature components using the correction factor, wherein amplitude and phase corrections are determined for multiple gain levels.

8. A method for balancing a complex signal transceiver, comprising:

receiving a first complex signal;

separating the first complex signal into first inphase and quadrature components;

processing the first inphase and quadrature components and determining an imbalance between the first inphase and quadrature components;

generating a correction factor based on the determined imbalance;

receiving a second complex signal;

separating the second complex signal into second inphase and quadrature components; and balancing the second inphase and quadrature components using the correction factor, wherein the first complex signal is a modulated signal having known modulation characteristics, the method further comprising:

comparing the known modulation characteristics to modulation characteristics of the received second complex signal to determine the imbalance.

9. A method for balancing a complex signal transceiver, comprising:

receiving a first complex signal;

separating the first complex signal into first inphase and quadrature components;

processing the first inphase and quadrature components and determining an imbalance between the first inphase and quadrature components;

generating a correction factor based on the determined imbalance;

receiving a second complex signal;

separating the second complex signal into second inphase and quadrature components; and balancing the second inphase and quadrature components using the correction factor, wherein the generating step further comprises:

detecting a current temperature;

taking into account an effect of the detected temperature on the imbalance in the correction factor.

10. A method of balancing a receiver that receives a quadrature signal having inphase and quadrature components, comprising:
determining an imbalance between the inphase and quadrature components;
generating a correction factor to compensate for the determined imbalance including:
generating a phase control signal for controlling a phase angle between inphase and quadrature components of the subsequently received signal, and
generating an amplitude adjustment factor to be applied to the amplitude of the inphase and quadrature components of the subsequently received signal;
applying the correction factor to a subsequently received signal to reduce an imbalance between inphase and quadrature components of the subsequently received signal; and
iteratively varying the phase control signal and the amplitude adjustment factor until a minimum imbalance signal is obtained.

11. The method in claim 10, further comprising:
generating a known frequency signal that is different than a receive frequency to which the receiver is currently tuned;
separating the known frequency signal into FM inphase and quadrature components;
determining a difference between the known frequency signal and a recovered frequency signal and
detecting an imbalance between the inphase and quadrature components using the determined difference.

12. The method in claim 11, wherein the recovered frequency signal includes frequency components other than the known frequency and wherein the imbalance signal corresponds to the other frequency components.

13. The method in claim 12, wherein the correction factor is generated to minimize the other frequency components.

14. The method in claim 10, further comprising the steps of:
(a) incrementing a phase control signal to generate a current phase control signal;
(b) incrementing an amplitude control signal to generate a current amplitude control signal;
(c) determining whether a new imbalance generated for the subsequently received signal is less than a current imbalance;
(d) repeating steps (a)–(c) until a minimum imbalance for the current phase control signal is determined.

15. A radio receiver, comprising:
an antenna;
a signal generator for generating a known radio frequency (RF) signal;
a quadrature demodulator for receiving RF signals including the known RF signal and converting the received RF signals including the known RF signal into inphase baseband and quadrature baseband signals including:
a frequency generator tuned to a radio receive channel at a first frequency;
a first mixer connected to the frequency generator output and converting the received RF signal into an inphase baseband signal;
a phase splitter for generating an RF output signal at the first frequency and out of phase with the frequency generator applied by 90 degrees including a tunable filter for adjusting the phase shift applied to the RF oscillator output; and
a second mixer connected to the phase splitter for converting the received RF signal into a quadrature baseband signal, and
a signal processor determining an imbalance between the inphase and quadrature signals of the known RF signal, generating a correction factor, and applying the correction factor to subsequently received inphase and quadrature baseband signals to minimize an imbalance between the subsequently received inphase and quadrature baseband signals; and
a switch for connecting one of an antenna and the signal generator to the quadrature demodulator, wherein the signal processor controls the switch to connect the signal generator to the quadrature receiver to initialize the radio receiver at power up or to update the radio receiver during the idle time periods and controls the switch to connect the antenna to the quadrature receiver at times other than power up or the idle times.

16. The radio receiver in claim 15, wherein the signal processor determines a phase difference between the inphase and quadrature components, converts the determined phase into frequency and detects the imbalance signal from the frequency.

17. The radio receiver in claim 16, wherein the imbalance signal has a frequency that is twice that of a difference between the first and second frequencies.

18. The radio receiver in claim 17, wherein the signal processor generates the correction factor to minimize the imbalance signal frequency.

19. The radio receiver in claim 17, the determined imbalance includes imbalances in amplitude and phase between the first inphase and quadrature components and the correction factor includes an amplitude correction and a phase correction.

20. The radio receiver in claim 19, wherein the signal processor iteratively varies a phase control signal and an amplitude adjustment factor until a minimum imbalance signal is obtained.

21. The radio receiver in claim 19, wherein the signal processor performs the tasks of:
(a) incrementing a phase control signal to generate a current phase control signal;
(b) incrementing an amplitude control signal to generate a current amplitude control signal;
(c) determining whether a new imbalance generated for the subsequently received signal is less than a current imbalance;
(d) repeating tasks (a)–(c) until a minimum imbalance for the current phase control signal is determined.

22. The radio receiver in claim 15, wherein the signal processor is a digital signal processor, the radio receiver further comprising:
inphase and quadrature signal analog-to-digital converters connected to the inphase and quadrature signals, respectively; and
inphase and quadrature multipliers connected respectively to digital outputs of the inphase and quadrature analog-to-digital converters, wherein one of the inphase and quadrature multipliers multiplies an amplitude correction factor with a corresponding one of the digitized inphase and quadrature signals to correct for amplitude imbalance.

23. A radio receiver, comprising:
an antenna;
a signal generator for generating a known radio frequency (RF) signal;
a quadrature demodulator for receiving RF signals including the known RF signal and converting the received RF signals including the known RF signal into inphase baseband and quadrature baseband signals; and
a signal processor determining an imbalance between the inphase and quadrature signals of the known RF signal, generating a correction factor, and applying the correction factor to subsequently received inphase and quadrature baseband signals to minimize an imbalance between the subsequently received inphase and quadrature baseband signals; and
an automatic gain controller, wherein the signal processor determines the correction factor for multiple gain levels.

24. A radio receivers comprising:
an antenna:
a signal generator for generating a known radio frequency (RF) signal;
a quadrature demodulator for receiving RF signals including the known RF signal and converting the received RF signals including the known RF signal into inphase baseband and quadrature baseband signals; and
a signal processor determining an imbalance between the inphase and quadrature signals of the known RF signal, generating a correction factors and applying the correction factor to subsequently received inphase and quadrature baseband signals to minimize an imbalance between the subsequently received inphase and quadrature baseband signals,
wherein the signal processor determines the correction factor for different temperatures.

25. A radio receiver, comprising:
an antenna;
a signal generator for generating a known radio frequency (RF) signal;
a quadrature demodulator for receiving RF signals including the known RF signal and converting the received RF signals including the known RF signal into inphase baseband and quadrature baseband signals; and
a signal processor determining an imbalance between the inphase and quadrature signals of the known RF signal, generating a correction factors and applying the correction factor to subsequently received inphase and quadrature baseband signals to minimize an imbalance between the subsequently received inphase and quadrature baseband signals,
wherein the signal generator includes a frequency generator connected to an attenuator, generating a first signal having a frequency that is different from a receive frequency to which the radio receiver is currently tuned, and
wherein the signal processor controls the frequency generator and the receive frequency to maintain the frequency difference.

26. A radio transceiver, comprising:
an antenna;
a signal generator generating a known radio frequency (RF) signal;
a quadrature demodulator demodulating the known RF signal and converting the received RF signal into an inphase baseband signal and a quadrature baseband signal;
a signal processor determining a quadrature demodulator imbalance between the inphase and quadrature signal, generating a correction factor, and applying the correction factor to subsequently received inphase and quadrature signals to compensate for the quadrature demodulator imbalance; and
a quadrature modulator connected to the signal processor and the antenna, wherein the compensated inphase and quadrature signals are modulated by the quadrature modulator.

27. The radio transceiver in claim 26, further comprising:
an RF oscillator for generating inphase signals at a first frequency; and
a phase splitter connected to an output of the RF oscillator for generating quadrature RF signals at the first frequency but out of phase with the inphase signals by 90°;
wherein the inphase and quadrature signals generated by the RF oscillator and the phase splitter are fed to both the quadrature modulator and the quadrature demodulator.

28. A radio receiver, comprising:
an antenna;
a signal generator for generating a test signal at a known radio frequency (RF) signal;
a quadrature receiver for receiving RF signals including the test signal and converting received RF signals into inphase baseband and a quadrature baseband signals; and
a digital signal processor for performing the following tasks:
determining an imbalance in the quadrature receiver between the inphase and quadrature signals of the test signal under varying conditions,
generating a correction factor for at least some of the varying conditions, and
applying one or more correction factors to subsequently received inphase and quadrature baseband signals depending on a current condition to minimize an imbalance between the subsequently received inphase and quadrature baseband signals.

29. The radio receiver in claim 28, wherein one of the varying conditions is which of plural RF channels the radio receiver is currently receiving.

30. The radio receiver in claim 28, further comprising:
automatic gain control stages for the inphase baseband and a quadrature baseband signals, wherein one of the varying conditions is one of plural automatic gain control levels.

31. The radio receiver in claim 28, wherein one of the varying conditions is temperature.

32. The radio receiver in claim 28, wherein the quadrature receiver includes:
means for converting the inphase and quadrature signals of the test signal into a frequency output, and
wherein determining task includes:
processing the frequency output to remove low frequency components,
determining the magnitude of the processed signal, and
calculating the imbalance signal from the determined magnitude.

33. The radio receiver in claim 28, wherein the balancing task generates a quadrature angle control correction signal and an amplitude correction signal and includes:
(a) adding a quadrature increment to a current quadrature angle control correction signal to generate a new quadrature angle control correction signal;

(b) performing a minimum amplitude imbalance task to determine a minimum amplitude correction signal for the new quadrature angle control correction signal;

(c) detecting a new imbalance signal;

(d) determining if the new imbalance signal exceeds an old imbalance signal;

(e) if not, repeating steps (a)–(e).

34. The radio receiver in claim 33, wherein if the new imbalance signal exceeds an old imbalance signal, another quadrature increment of opposite polarity is added to the current quadrature angle control correction signal and steps (b)–(e) are repeated.

35. The radio receiver in claim 33, wherein the minimum amplitude imbalance task includes:

(a) adding an amplitude increment to a current amplitude correction signal to generate a new amplitude correction signal;

(b) detecting a new imbalance signal;

(c) determining if the new imbalance signal exceeds an old imbalance signal;

(d) if not, repeating steps (a)–(d).

36. The radio receiver in claim 35, wherein if the new imbalance signal exceeds an old imbalance signal, another amplitude increment of opposite polarity is added to the current amplitude correction signal and steps (b)–(d) are repeated.

* * * * *